(12) United States Patent
Lin et al.

(10) Patent No.: US 11,342,319 B2
(45) Date of Patent: May 24, 2022

(54) DISPLAY DEVICE INCLUDING FAN-OUT LINES

(71) Applicant: InnoLux Corporation, Miao-Li County (TW)

(72) Inventors: Chun-Hsien Lin, Miao-Li County (TW); Tsau-Hua Hsieh, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 17/100,923

(22) Filed: Nov. 22, 2020

(65) Prior Publication Data
US 2021/0280567 A1     Sep. 9, 2021

(30) Foreign Application Priority Data
Mar. 5, 2020    (CN) .......................... 202010145675.0

(51) Int. Cl.
*H01L 25/16*    (2006.01)
*H01L 23/00*    (2006.01)

(52) U.S. Cl.
CPC ............ *H01L 25/167* (2013.01); *H01L 24/08* (2013.01); *H01L 24/32* (2013.01); *H01L 2224/08145* (2013.01); *H01L 2224/32105* (2013.01); *H01L 2224/32112* (2013.01); *H01L 2224/32225* (2013.01)

(58) Field of Classification Search
CPC ....... H01L 25/167; H01L 27/12; H01L 24/08; H01L 24/32; H01L 2224/08145; H01L 2224/32105; H01L 2224/32112; H01L 2224/32225; H01L 27/124; H01L 27/3293; G02F 1/1345
USPC ..... 257/72; 438/48, 128, 149, 151, 157, 283
See application file for complete search history.

(56) References Cited

U.S. PATENT DOCUMENTS

2018/0197484 A1*   7/2018   Moon ................. H01L 27/1248
2019/0095007 A1    3/2019   Jeong
2019/0148474 A1    5/2019   Bu

FOREIGN PATENT DOCUMENTS

| CN | 109560109 A | 4/2019 | |
|---|---|---|---|
| EP | 3 462 499 A2 * | 9/2018 | ............ H01L 27/12 |
| EP | 3 462 499 A2 | 4/2019 | |
| EP | 3 462 499 A3 | 8/2019 | |
| KP | 20110017280 A * | 2/2011 | ........... H01L 25/167 |
| KR | 10-2011-0017280 A | 2/2011 | |

* cited by examiner

*Primary Examiner* — Didarul A Mazumder
(74) *Attorney, Agent, or Firm* — Winston Hsu

(57) ABSTRACT

A display device includes a substrate, a first signal line disposed on the substrate, and a first pixel including a first transistor having a gate electrode, a source electrode and a drain electrode, wherein the source electrode is electrically connected to the first signal line. The display device includes a fan-out line electrically connected to the first signal line, wherein the fan-out line partially overlaps the first pixel and is formed in a layer different from layers of the gate electrode, the source electrode and the drain electrode.

9 Claims, 6 Drawing Sheets

DISPLAY DEVICE INCLUDING FAN-OUT LINES

BACKGROUND OF THE DISCLOSURE

1. Field of the Disclosure

The present disclosure relates to a display device. More particularly, the present disclosure relates to a display device including fan-out lines.

2. Description of the Prior Art

Large-size displays such as public information displays (PID), outdoor displays or indoor large-size movie theater displays have become more and more popular in modern life. The needs to splice plural display panels for forming a large-size display have been increased, and meanwhile, the requirements for reducing the sense of a gap between the spliced displays have been more and more critical.

SUMMARY OF THE DISCLOSURE

One aspect of the present disclosure is to provide a display device including fan-out lines. The fan-out lines are used to connect the signal lines (such as the data lines) and the driving elements, and are arranged in a conductive layer different from a layer of the data lines. In this way, a design of the fan-out lines overlapping the pixels of a display region may be realized. The area of a non-display region for fanning out the fan-out lines may be reduced, and the ratio of display region to the substrate may be increased. Thus, a sense of a gap or image discontinuity caused by the non-display region may be reduced.

According to one embodiment of the present disclosure, a display device is disclosed. The display device includes a substrate, a first signal line disposed on the substrate, and a first pixel including a first transistor having a gate electrode, a source electrode and a drain electrode, wherein the source electrode is electrically connected to the first signal line. The display device further includes a fan-out line electrically connected to the first signal line, wherein the fan-out line partially overlaps the first pixel and is formed in a layer different from layers of the gate electrode, the source electrode and the drain electrode.

These and other objectives of the present disclosure will no doubt become obvious to those of ordinary skill in the art after reading the following detailed description of the embodiment that is illustrated in the various figures and drawings.

BRIEF DESCRIPTION OF THE DRAWINGS

The accompanying drawings are included to provide a further understanding of the embodiments, and are incorporated in and constitute a part of this specification. For ease of understanding, same reference numerals are used to indicate the same elements in the drawings. It should be understood that the elements disclosed in one embodiment may be used in other embodiments without specific description. The drawings in this disclosure are not drawn to scale unless being specifically specified. For clarity of presentation, the drawings are simplified and some details or elements are omitted.

DETAILED DESCRIPTION

Figure 1B:
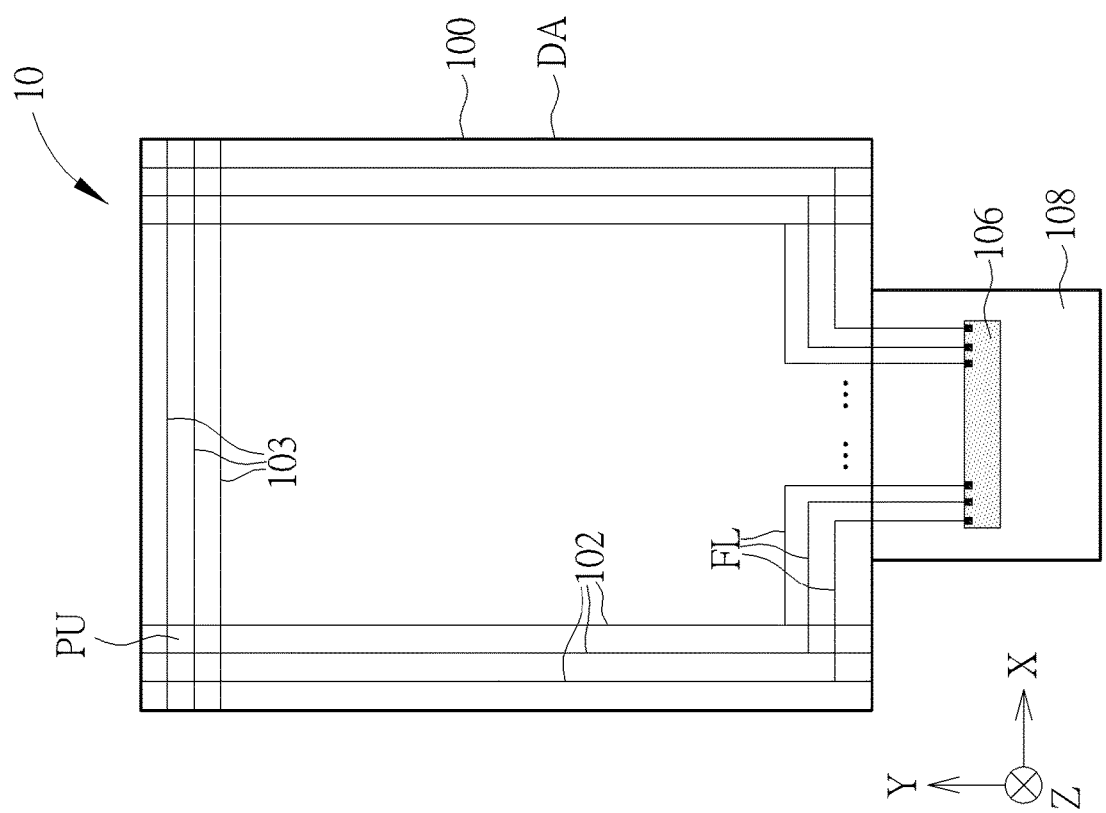
FIG. 1B is a schematic top plan view of a display device according to an embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of the electronic device, and certain components in various drawings may not be drawn to scale. In addition, the number and dimension of each component shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This disclosure does not intend to distinguish between components that differ in name but not in function. In the following description and in the claims, the terms "include", "comprise" and "have" are used in an open-ended fashion, and thus should be interpreted to mean "include, but not limited to . . . ".

It will be understood that when an element or layer is referred to as being "on" or "connected to" another element or layer, it may be directly on or directly connected to the other element or layer, or intervening elements or layers may be presented. In contrast, when an element is referred to as being "directly on" or "directly connected to" another element or layer, there are no intervening elements or layers presented.

Although the terms such as first, second, etc., may be used in the description and following claims to describe various components in claims, these terms does not mean or represent the claimed components have order and does not represent the order of one claimed component and another one claimed component, or the sequence in manufacturing method. These terms are used to discriminate a claimed component with a denomination from another one claimed component with the same denomination.

It should be noted that the technical features in different embodiments described in the following description may be replaced, recombined, or mixed with one another to constitute another embodiment without departing from the spirit of the present disclosure.

The display devices provided by the present disclosure may include general display devices or special display devices such as spliced display devices, foldable display devices, or flexible display devices, but are not limited thereto. Embodiments of the display devices disclosed in the present disclosure may include non-self-light-emitting liquid crystal displays (liquid crystal display, LCD), self-light-emitting displays such as organic light-emitting diode displays (OLED displays), inorganic light-emitting diode displays (LED displays), mini-LED displays, micro-LED displays, quantum-dot LED displays (QLED and QDLED display), electro-phoretic displays (EPD), or other types of displays that may show images and pictures, but are not limited thereto.

Figure 1A:
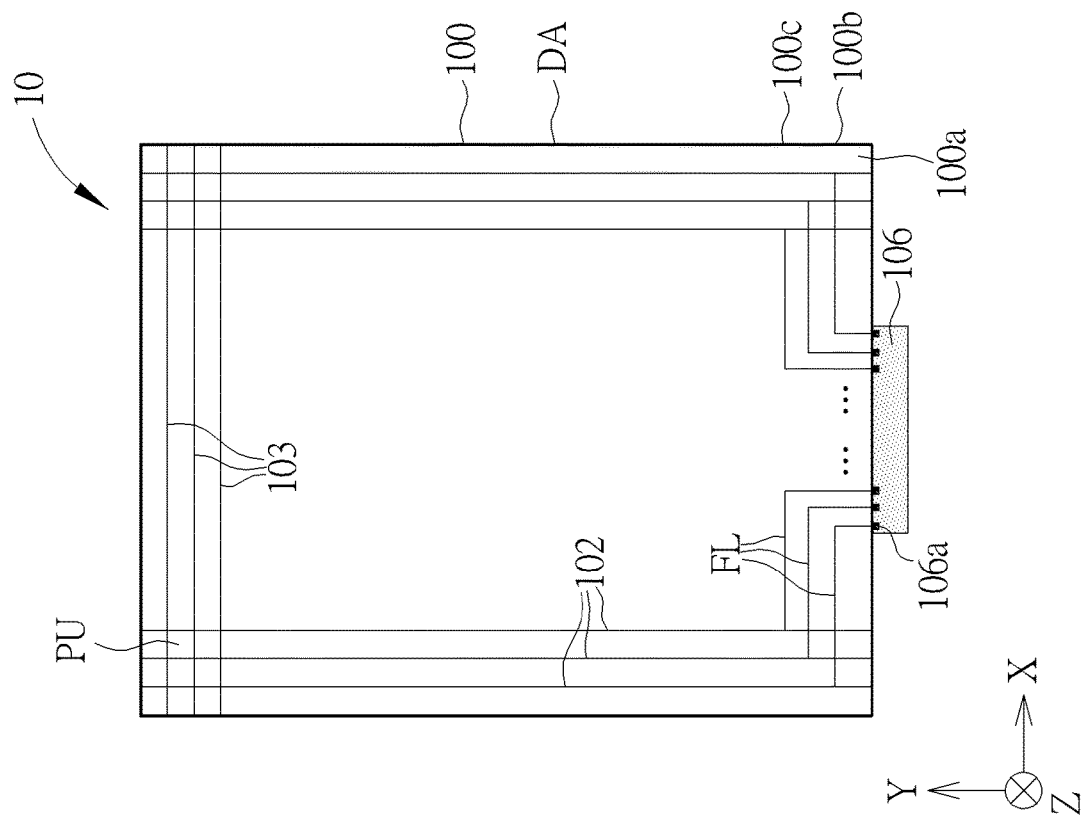
FIG. 1A is a schematic top plan view of a display device according to an embodiment of the present disclosure.
Figure 2:
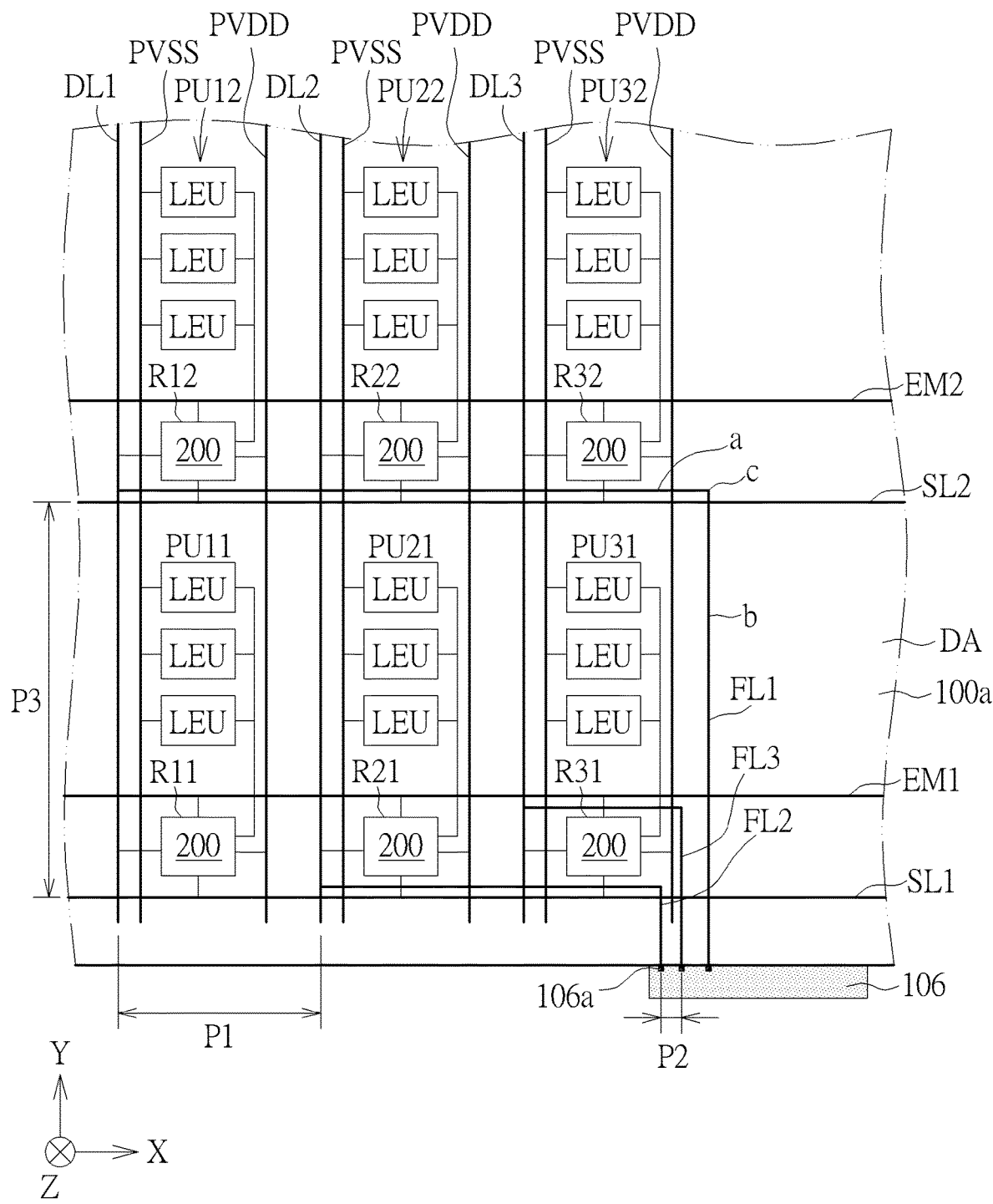
FIG. 2 is an enlarged schematic top plan view of a portion of a display device according to an embodiment of the present disclosure.
Figure 3:
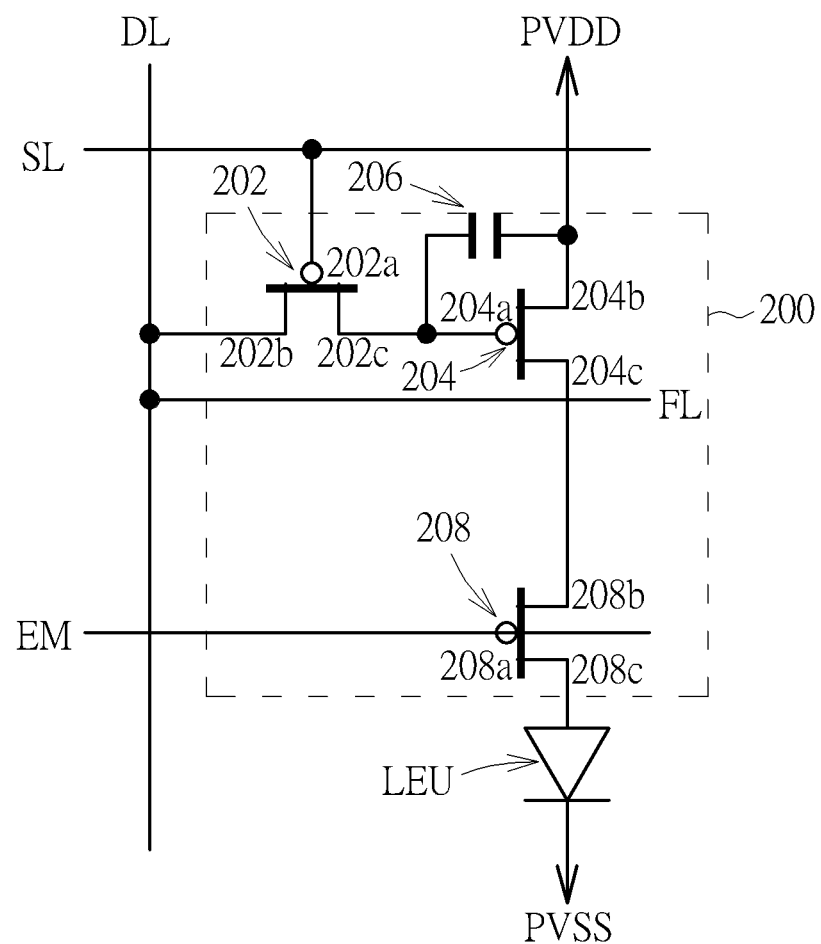
FIG. 3 is a circuit diagram of a driving circuit and a light emitting unit within a pixel of a display device according to an embodiment of the disclosure.

Please refer to FIG. 1A, FIG. 1B, FIG. 2 and FIG. 3. FIG. 1A is a schematic top plan view of a display device 10 from the Z direction according to an embodiment of the present disclosure. FIG. 1B is a schematic top plan view of a display device 10 according to another embodiment of the present disclosure. FIG. 2 is an enlarged schematic top plan view of a portion of the display device 10 from the Z direction as shown in FIG. 1A. FIG. 3 is a circuit diagram of a driving circuit 200 and a light emitting unit LEU of a pixel PU of the display device 10 as shown in FIG. 1A.

As shown in FIG. 1A, the display device 10 may be any type of display devices or any electronic device that is equipped with a display screen. The display device 10 may include a substrate 100 having a top surface 100a (the drawing surface or the surface defined by the X direction and the Y direction) and a bottom surface 100b (the backside of the drawing) that is opposite to the top surface 100a. The substrate 100 further includes a side surface 100c surrounding an edge of the top surface 100a. In some embodiments, the substrate 100 may include a hard substrate such as a glass substrate, a quartz substrate, or a sapphire substrate, or may include a flexible substrate made of, for example, polyimide (PI), polycarbonate (PC) or polyethylene terephthalate (PET), other suitable materials, or a combination of the above materials, but is not limited thereto. The top surface 100a of the substrate 100 includes a display region DA. The display region DA includes an array of pixels PU. The display region DA is where the display device 10 displays the images. A plurality of signal lines 102 and a plurality of signal lines 103 are arranged in the display region DA. The signal lines 102 may extend along the X direction, and the signal lines 103 may extend along the Y direction. The X direction may be perpendicular to the Y direction, but is not limited thereto. The signal lines 102 and the signal lines 103 are used to control the operations of the pixels PU. It should be noted that the signal lines 102 and the signal lines 103 may be any type of signal lines for transmitting signals and controlling the pixels PU in the display region DA of the display device 10. For example, in the embodiment shown in FIG. 3, which illustrates a circuit diagram of a pixel PU of the display device 10, the signal lines 102 and the signal lines 103 may respectively be the data lines DL, the scan lines SL, the emitting control lines EM, the power lines PVDD, the ground potential lines PVSS, or the clock signal lines (not shown), but are not limited thereto.

As shown in FIG. 1A, at least a driving device 106 is disposed on one side of the display region DA. The driving device 106 may include a plurality of pins 106a, which are respectively electrically connected to a corresponding signal line 102 in the display region DA through a fan-out line FL. The driving device 106 and the output driving signals thereof may be any type of driving devices and output driving signals according to circuit configurations. For example, in some embodiments, when the signal lines 102 are data lines DL, the driving device 106 may be a data driver used to provide data signals to the selected signal lines 102 to control the voltages applied to the pixels PU. In other embodiments, when the signal lines 102 are scan lines SL, the driving device 106 may be a scan driver used to provide scan signals to the selected signal lines 102 to control the switch (on and off) of the pixels PU.

Please refer to FIG. 1B, which is a schematic top plan view of a display device 10 from the Z direction according to another embodiment of the present disclosure. The difference between FIG. 1A and FIG. 1B is that the driving device 106 of the display device 10 shown in FIG. 1B is bonded on a control board 108 that is disposed on one side of the substrate 100. The driving device 106 may be bonded on the control board 108 by surface-mounting or welding, but is not limited thereto. The control board 108 may be, for example, a flexible printed circuit (FPC) board or a printed circuit film. The arrangement of the driving device 106 on the control board 108 may be referred to as chip-on-film (COF) bonding. The control board 108 may be electrically connected to the terminals of the leading out segment "b" (shown in FIG. 2) of the fan-out line FL by, for example, anisotropic conductive film (ACF), but is not limited thereto. Embodiments showing more details about the arrangements of the control board 108 are shown in FIG. 5 to FIG. 8.

It should be noted that the quantities and arrangements of the driving devices 106 and the fan-out lines FL may be flexibly designed to match product specifications (such as panel size, types of driving devices, etc.). In some embodiments, the display device 10 may further include a plurality of circuit elements with different functions disposed in the display region DA. For example, circuit elements such as driving devices, reset devices, compensation devices, initialization devices, operation control devices, light emitting control devices, capacitors, inductors, power lines, or a combination thereof, may be disposed in the display region DA to control the operations of the pixels PU, but is not limited thereto.

According to one embodiment of the present disclosure, as illustrated in the following description, the signal lines 102 may be data lines DL and are connected to the fan-out lines FL. It should be understood that the fan-out lines FL provided by the present disclosure may be used to connect other types of signal lines such as scan lines SL, emitting control lines EM, power lines PVDD, ground potential lines PVSS, or clock signal lines, but are not limited thereto. In the following description, the first data line DL1 may be referred to as a first signal line. The second data line DL2 may be referred to as a second signal line. The second scan line SL2 may be referred to as a third signal line. The data writing transistor 202 of the first pixel PU12 that is electrically connected to the first data line DL1 may be referred to as a first transistor. The data writing transistor 202 of the second pixel PU22 that is electrically connected to the second data line DL2 may be referred to as a second transistor.

Please refer to FIG. 2, which shows an enlarged top plan view of a portion of the display region DA adjacent to the driving device 106. As shown in FIG. 2, the display region DA of the substrate 100 includes a plurality of signal lines for controlling each of the pixels PU. The signal lines of the display device 10 may include data lines DL, such as the first data line DL1 for controlling the first pixel PU12 and the fourth pixel PU11, the second data line DL2 for controlling the second pixel PU22 and the fifth pixel PU21, and the third data line DL3 for controlling the third pixel PU32 and the sixth pixel PU31. The signal lines of the display device 10 may further include a plurality of scan lines SL and emitting control lines EM, such as the first scan line SL1 and the first emitting control line EM1 for controlling the fourth pixel PU11, the fifth pixel PU21 and the sixth pixel PU31, and the second scan line SL2 and the second emitting control line EM2 for controlling the first pixel PU12, the second pixel PU22 and the third pixel PU32.

As shown in FIG. 2, the first data line DL1, the second data line DL2, and the third data line DL3 extend along the Y direction and are adjacently arranged along the X direction. The first scan line SL1, the first emitting control line EM1, the second scan line SL2, and the second emitting control line EM2 extend along the X direction and are alternately arranged along the Y direction. It should be noted that the arrangements of the data lines DL, the scan lines SL, and the emitting control lines EM shown in FIG. 2 are only examples and should not be taken as limitations to the present disclosure.

In some embodiments, the pixels PU shown in FIG. 1A and FIG. 1B may correspond to the rectangular regions between the first data line DL1, the second data line DL2, the third data line DL3, the first scan line SL1 and the second scan line SL2 shown in FIG. 2, such as the first pixel PU12, the second pixel PU22, the third pixel PU32, the fourth pixel PU11, the fifth pixel PU21, and the sixth pixel PU31. In some embodiments, the width of each pixel PU is approximately equal to the distance P1 between the neighboring data lines DL, and the length of each pixel PU is approximately equal to the distance P3 between the neighboring scan lines SL. More specifically, the width of each pixel PU may be equal to the maximum distance along the X direction between the opposite sides of two neighboring data lines DL (for example, the right side of the first data line DL1 and the left side of the second data line DL2). The length of each pixel PU may be equal to the maximum distance along the Y direction between the opposite sides of two neighboring scan lines SL (for example, the upper side of the first scan line SL1 and the lower side of the second scan line SL2). In other embodiments, as preferred, the regions of the pixels may be defined by other signal lines.

Each pixel PU includes a driving circuit 200 disposed in a driving circuit region of the pixel PU. The driving circuit 200 is used to control the light emitting unit LEU of the pixel PU. For example, as shown in FIG. 2, the first pixel PU12 includes a driving circuit 200 disposed in a driving circuit region R12, the second pixel PU22 includes a driving circuit 200 disposed in a driving circuit region R22, the third pixel PU32 includes a driving circuit 200 disposed in a driving circuit region R32, the fourth pixel PU11 includes a driving circuit 200 disposed in a driving circuit region R11, the fifth pixel PU21 includes a driving circuit 200 disposed in a driving circuit region R21, and the sixth pixel PU31 includes a driving circuit 200 disposed in a driving circuit region R31. It should be noted that the light emitting units LEU are disposed in a region outside the driving circuit regions R11~R31 of the pixels PU of the display device 10. In other words, when viewing from the top (from the Z direction), the light emitting units LEU and the elements (such as data writing transistors, driving transistors, capacitors, and light emitting transistors, etc.) of the driving circuit regions R11~R31 do not overlap. As shown in FIG. 2, a plurality of power lines PVDD and a plurality of ground potential lines PVSS may be disposed on the substrate 100 and respectively connected to the driving circuits 200 of the pixels PU. It should be understood that the electrical connection relationships between the driving circuits 200 and the signal lines are not limited to that shown in FIG. 2.

Please continue to refer to FIG. 2. The driving device 106 may include a plurality of pins 106a. The data lines DL (such as the first data line DL1, the second data line DL2, and the third data line DL3) are respectively electrically connected to one of the pins 106a of the driving device 106 through one of the fan-out lines FL (such as the first fan-out line FL1, the second fan-out line FL2, or the third fan-out line FL3). In some embodiments, the distance between adjacent pins 106a of the driving device 106 may be distance P2.

In some embodiments, the fan-out lines FL (such as the first fan-out line FL1, the second fan-out line FL2, or the third fan-out line FL3) are substantially disposed in the display region DA. Each of the fan-out line FL may include several segments for smoothly connecting the pin 106a and the corresponding signal line 102. For example, as shown in FIG. 2, the first fan-out line FL1, the second fan-out line FL2, and the third fan-out line FL3 respectively include a fanning out segment "a", a leading out segment "b", and a bending segment "c" connected between the fanning out segment "a" and the leading out segment "b". A terminal of the fanning out segment "a" is connected to a signal line (such as the first data line DL1, the second data line DL2, or the third data line DL3), and the other terminal of the fanning out segment "a" is connected to a terminal of the bending segment "c". Meanwhile, a terminal of the leading out segment "b" is connected to another terminal of the bending segment "c", and the other terminal of the leading out segment "b" is connected to a pin 106a of the driving device 106. It should be noted that the shapes of the design of the fanning out segment "a", the leading out segment "b", and the bending segment "c" shown in FIG. 2 are only embodiments for ease of description. The design of the fanning out segment "a", the leading out segment "b" and/or the bending segment "c" of each fan-out line FL may be adjusted according to design requirements. In some embodiments, the fanning out segment "a" may extend in a direction non-parallel to the X direction, and the leading out segment "b" may extend in a direction non-parallel to the Y direction, but is not limited thereto.

In some embodiments, the first fan-out line FL1, the second fan-out line FL2, and the third fan-out line FL3 may have different lengths in order to smoothly connect the data lines DL and the corresponding pins 106a of the driving device 106.

In the embodiment shown in FIG. 2, the fanning out segments "a" of the first fan-out line FL1, the second fan-out line FL2, and the third fan-out line FL3 may overlap the driving circuit regions of the pixels PU, respectively. In one embodiment, the fanning out segments "a" of the first fan-out line FL1, the second fan-out line FL2, and the third fan-out line FL3 may respectively cross over some of the data lines. When viewing from the top (from the Z direction), the fanning out segments "a" of the first fan-out line FL1, the second fan-out line FL2, and the third fan-out line FL3 may respectively have intersections with the first data line DL1, the second data line DL2, and/or the third data line DL3. At least an insulating layer may be disposed between the fan-out lines FL and the data lines in a cross-sectional view of the intersections along the Z direction.

In the embodiment shown in FIG. 2, the fanning out segment "a" of the first fan-out line FL1 that is connected to the first data line DL1 may cross over other data lines, such as the second data line DL2. In some embodiments, the first fan-out line FL1, the second fan-out line FL2, and the third fan-out line FL3 do not overlap the regions where the light emitting units LEU are disposed. In some embodiments, the first fan-out line FL1, the second fan-out line FL2, and the third fan-out line FL3 do overlap the bonding pads (such as the bonding pad 410 and the bonding pad 412 shown in FIG. 4) for bonding the light emitting units LEU when viewing from the Z direction. In the embodiment shown in FIG. 2, the fanning out segment "a" of the first fan-out line FL1 is connected to the first data line DL1 and extends across the driving circuit region R12, the driving circuit region R22 and the driving circuit region R32 along the X direction, while the leading out segment "b" of the first fan-out line FL1 extends between adjacent pixels along the Y direction. It should be noted that the arrangements of the first fan-out line FL1, the second fan-out line FL2, the third fan-out line FL3 and the first data line DL1, the second data line DL2 and the third data line DL3 illustrated above are only examples. The layouts and arrangements of the fan-out lines FL and the data lines connected to the fan-out lines FL may be adjusted according to the design layout of the pixels.

In some embodiments, the data lines (including the first data line DL1, the second data line DL2, and the third data line DL3), the scan lines (including the first scan line SL1 and the second scan line SL2), the emitting control lines (including the first emitting control line EM1 and the second emitting control line EM2), the fan-out lines (including the first fan-out line FL1, the second fan-out line FL2, and the third fan-out line FL3), the power lines PVDD and the ground potential lines PVSS may be formed in the same or different conductive layers in order to form the electrical connections between the signal lines and the driving circuit 200.

Please refer to the circuit diagram shown in FIG. 3. According to an embodiment of the disclosure, the driving circuit 200 may include a data writing transistor 202, a driving transistor 204, a capacitor 206, and a light emitting transistor 208. The data writing transistor 202 has a gate terminal 202a, a source terminal 202b and a drain terminal 202c, wherein the gate terminal 202a is connected to a scan line SL, and the source terminal 202b is connected to a data line DL. The driving transistor 204 has a gate terminal 204a, a drain terminal 204b and a source terminal 204c, wherein the gate terminal 204a is connected to the drain terminal 202c of the data writing transistor 202, and the drain terminal 204b is connected to a power line PVDD. The capacitor 206 is connected to the gate terminal 204a and the drain terminal 204b of the driving transistor 204. The light emitting transistor 208 has a gate terminal 208a connected to an emitting control line EM, a drain terminal 208b connected to the source terminal 204c of the driving transistor 204, and a source terminal 208c connected to the light emitting unit LEU disposed outside the region of the driving circuit 200. An anode LEUa of the light emitting unit LEU is connected to the source terminal 208c of the light emitting transistor 208, and a cathode LEUb of the light emitting unit LEU is connected to a ground potential line PVSS. The fan-out line FL is connected to the data line DL and transmits signals of the driving device 106 to the data line DL.

It should be noted that the drive circuit 200 of the pixel PU shown in FIG. 3 which includes the data writing transistor 202, the driving transistor 204, the capacitor 206, the light emitting transistor 208, and the light emitting unit LEU is an example and should not be taken as limitations to the present disclosure. Driving circuits including other circuit elements or different quantities of transistors and/or capacitors are also within the scope of the present disclosure.

A correspondence between the circuit diagram shown in FIG. 3 and the driving circuit 200 of the first pixel PU12 shown in FIG. 2 is that, the data line DL shown in FIG. 3 may correspond to the first data line DL1 shown in FIG. 2. The scan line SL shown in FIG. 3 may correspond to the second scan line SL2 shown in FIG. 2. The emitting control line EM shown in FIG. 3 may correspond to the second emitting control line EM2 shown in FIG. 2. The fan-out line FL shown in FIG. 3 may correspond to the first fan-out line FL1 shown in FIG. 2.

It should be noted that, for the sake of simplicity, only one light emitting unit LEU and the driving circuit controlling the light emitting unit LEU are shown in the circuit diagram of FIG. 3. As shown in FIG. 2, the pixels PU may respectively include a plurality of light emitting units LEU. In some embodiments, when a pixel PU includes a plurality of light emitting units LEU, the light emitting units LEU may respectively function as a light source element of different colors. For example, the light emitting units LEU of the same pixel PU may respectively be a red light emitting diode, a green light emitting diode, a blue light emitting diode, or a light emitting diode emitting infrared or ultra-violet, but are not limited thereto.

Figure 4:
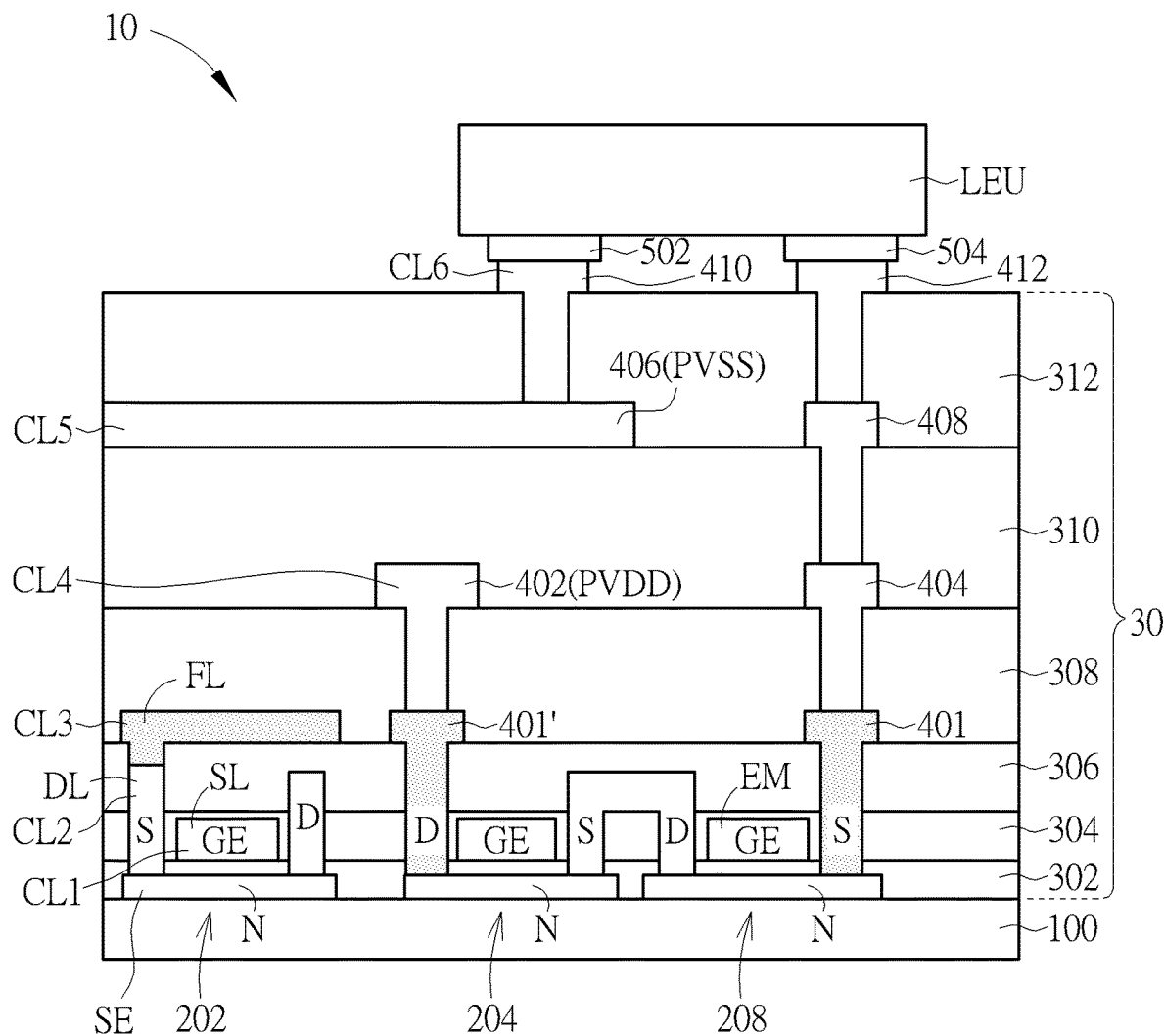
FIG. 4 is a schematic cross-sectional view of a portion of a display device according to an embodiment of the present disclosure.

Please refer to FIG. 4, which is a schematic cross-sectional view of a portion of a display device 10. The cross-sectional view shown in FIG. 4 is taken along the Z direction. It should be noted that, for the sake of simplifying the drawing and the illustration, the elements of the circuit structure layer 30 such as the data writing transistor 202, the driving transistor 204, the light emitting transistor 208, the conductive structure 401, the conductive structure 401', the conductive structure 402, the conductive structure 404, the conductive structure 406, the conductive structure 408, the bonding pad 410, the bonding pad 412 and the light emitting unit LEU are simultaneously depicted in FIG. 4 disregarding the positions thereof in the top plan view. It should be noted that FIG. 4 should not be used to limit an overlapping or non-overlapping relationship between the structures along the Z direction. In some embodiments of the present disclosure, by designing the wiring layouts of the conductive structure 401, the conductive structure 404, the conductive structure 406 and/or the conductive structure 408, it may be realized to form the bonding pad 410, the bonding pad 412 and the light emitting unit LEU in a region that does not overlap the elements of the driving circuit 200 such as the data writing transistor 202, the driving transistor 204 and/or the light emitting control transistor 208 along the Z direction. In some embodiments, it may be realized to form the bonding pad 410, the bonding pad 412 and the light emitting unit LEU in a region that is outside the driving circuit region. In this way, the elements of the driving circuit 200 may be prevented from the influences caused by the high temperature or stress during the process of bonding the light emitting unit LEU.

In FIG. 4, as an example, the data writing transistor 202, the driving transistor 204 and the light emitting control transistor 208 may be top-gate type thin-film-transistors (TFTs). In other embodiments, the data writing transistor 202, the driving transistor 204 and the light emitting control transistor 208 may be bottom gate type thin-film-transistors (TFTs).

As shown in FIG. 4, the display device 10 may include a thin-film-transistor (TFT) substrate or a circuit board, but is not limited thereto. In some embodiments, the display device 10 may include a substrate 100, a circuit structure layer 30, and a light emitting unit LEU disposed on the circuit structure layer 30. In some embodiments, the substrate 100 shown in FIG. 4 may include a hard substrate, for example, a glass substrate, a ceramic substrate, a quartz substrate, or a sapphire substrate, or may include a flexible substrate made of, for example, polyimide (PI), polycarbonate (PC) or polyethylene terephthalate (PET), other suitable materials, or a combination of the above materials, but is not limited thereto.

The circuit structure layer 30 disposed on the substrate 100 may include a multi-layered structure. The circuit structure layer 30 may include the data writing transistor 202, the driving transistor 204, the light emitting transistor 208, the capacitor 206, the fan-out line FL, the data line DL, the scan line SL, the emitting control line EM, the power line PVDD and the ground potential line PVSS of the driving circuit 200 formed therein to control the light emitting unit LEU bonded on the substrate 100. In some embodiments, as shown in FIG. 4, the data writing transistor 202, the driving transistor 204, and the light emitting transistor 208 may include top-gate thin-film transistors, but is not limited thereto. In some embodiments, the data writing transistor 202, the driving transistor 204, and the light emitting transistor 208 respectively include a channel region N, a gate electrode GE disposed on the channel region N and separated from the channel region N by a gate insulating layer 302, a source electrode S and a drain electrode D disposed on the channel region N and respectively at two sides of the gate electrode GE.

Please also refer to the circuit diagram shown in FIG. 3. Regarding the data writing transistor 202, the gate electrode GE corresponds to the gate terminal 202a, the source electrode S corresponds to the source terminal 202b, and the drain electrode D corresponds to the drain terminal 202c. Regarding the driving transistor 204, the gate electrode GE corresponds to the gate terminal 204a, the source electrode S corresponds to the source terminal 204b, and the drain electrode D corresponds to the drain terminal 204c. Regarding the light emitting transistor 208, the gate electrode GE corresponds to the gate terminal 208a, the source electrode S corresponds to the source terminal 208b, and the drain electrode D corresponds to the drain terminal 208c.

The channel regions N of the data writing transistor 202, the driving transistor 204, and the light emitting transistor 208 may be formed by patterning a semiconductor layer SE. In some embodiments, the material of the semiconductor layer SE may include, for example, metal oxide, amorphous silicon, low temperature polysilicon (LTPS) or low-temperature polycrystalline oxide (LTPO), but is not limited thereto. In other embodiments, the semiconductor layer SE may include an oxide of at least one metal selected from a group comprising: indium (In), gallium (Ga), tin (Sn), zirconium (Zr), vanadium (V), Hafnium (Hf), cadmium (Cd), germanium (Ge), chromium (Cr), titanium (Ti), tantalum (Ta) and zinc (Zn). In some embodiments, the data writing transistor 202, the driving transistor 204, and the light emitting transistor 208 may be formed in semiconductor layers SE made of different materials selected from the group mentioned above.

The gate insulating layer 302 may include a dielectric material. In some embodiments, the gate insulating layers 302 may include a dielectric material such as silicon nitride (SiNx), silicon oxide (SiOx), silicon oxynitride (SiON), aluminum oxide ($Al_2O_3$), titanium oxide ($TiO_2$), tantalum oxide ($Ta_2O_5$), hafnium oxide ($HfO_2$), zirconium oxide ($ZrO_2$), or a combination thereof, but is not limited thereto. In some embodiments, the gate insulating layer 302 may have a single-layered structure or a multi-layered structure. In some embodiments, the portions of the gate insulating layers 302 between the gate electrodes GE and the channel regions N of the data writing transistor 202, the driving transistor 204, and the light emitting transistor 208 may include different dielectric materials.

The conduction and disconnection (on and off) of the channel regions N of the data writing transistor 202, the driving transistor 204, and the light emitting transistor 208 are by the respective gate electrodes GE disposed thereon. The gate electrodes GE of the data writing transistor 202, the driving transistor 204, and the light emitting transistor 208 may be formed by patterning a first conductive layer CL1. In some embodiments, the scan line SL may be formed simultaneously with the gate electrode GE of the data writing transistor 202 by patterning the first conductive layer CL1. In other words, the scan line SL and the gate electrode GE of the data writing transistor 202 may be formed in the same conductive layer. In some embodiments, the emitting control line EM may be formed simultaneously with the gate electrode GE of the light emitting transistor 208 by patterning the first conductive layer CL1, but is not limited thereto.

In some embodiments, an insulating layer 304 of the circuit structure layer 30 may be disposed on the gate electrodes GE of the data writing transistor 202, the driving transistor 204, and the light emitting transistor 208, and a second conductive layer CL2 may be disposed on the insulating layer 304. A portion of the second conductive layer CL2 may extend through the insulating layer 304 and the gate insulating layer 302 to contact or electrically connect to the semiconductor layer SE, thereby forming the source electrode S and the drain electrode D of the data writing transistor 202, the source electrode S of the driving transistor 204, and the drain electrode D of the light emitting transistor 208. In some embodiments, the data line DL may be may be formed simultaneously with the source electrode S of the data writing transistor 202 by patterning the second conductive layer CL2. In other words, the data line DL and the source electrode S of the data writing transistor 202 may be formed in the same conductive layer, but is not limited thereto.

In some embodiments, an insulating layer 306 of the circuit structure layer 30 may be disposed on the insulating layer 304 and the second conductive layer CL2, and a third conductive layer CL3 may be disposed on the insulating layer 306. A portion of the third conductive layer CL3 may extend through the insulating layer 306, the insulating layer 304 and the gate insulating layer 302 to contact or electrically connect to the semiconductor layer SE, thereby forming the drain electrode D of the driving transistor 204 and the source electrode S of the light emitting transistor 208. In some embodiments, the fan-out line FL may be formed by patterning the third conductive layer CL3 and electrically connected to the data line DL formed by the second conductive layer CL2. In some embodiments, a conductive structure 401' and a conductive structure 401 may be formed by the third conductive layer CL3 and respectively disposed on the drain electrode D of the driving transistor 204 and on the source electrode S of the light emitting transistor 208. The conductive structure 401' and the conductive structure 401 may be used for wiring and/or as interconnect structures between the drain electrode D of the driving transistor 204, the source electrode S of the light emitting transistor 208 and an upper conductive structures (such as the conductive structure 402 and the conductive structure 404).

In some embodiments, an insulating layer 308 of the circuit structure layer 30 may be disposed on the insulating layer 306 and the third conductive layer CL3, and a fourth conductive layer CL4 may be disposed on the insulating layer 308. A portion of the fourth conductive layer CL4 may extend through the insulating layer 308 to contact or electrically connect to the conductive structure 401 and the conductive structure 401'. In some embodiments, the fourth conductive layer CL4 may have a conductive structure 402 and a conductive structure 404 formed therein. The conductive structure 402 may be the power line PVDD or a wiring line for connecting to the power line PVDD. The conductive structure 404 may be a wiring line or a interconnect structure to an upper conductive structure (such as the conductive structure 408).

In some embodiments, an insulating layer 310 of the circuit structure layer 30 may be disposed on the insulating layer 308 and the fourth conductive layer CL4, and a fifth conductive layer CL5 may be disposed on the insulating layer 310. In some embodiments, the fifth conductive layer CL5 may have a conductive structure 406 and a conductive structure 408 formed therein. As shown in FIG. 4, the conductive structure 408 may extend through the insulating layer 310 to contact or electrically connect to the conductive structure 404, but is not limited thereto. The conductive structure 406 and the conductive structure 408 may be used as wiring lines or interconnect structures to an upper conductive layer (such as the sixth conductive layer CL6). In some embodiments, the conductive structure 406 may be the ground potential line PVSS or a wiring line for connecting to the ground potential line PVSS.

In some embodiments, an insulating layer 312 of the circuit structure layer 30 may be disposed on the insulating layer 310 and the fifth conductive layer CL5, and a sixth conductive layer CL6 may be disposed on the insulating layer 312. In some embodiments, the sixth conductive layer CL6 may have a bonding pad 410 and a bonding pad 412 formed therein. The bonding pad 410 and the bonding pad 412 respectively electrically connect to the conductive structure 406 (the ground potential line PVSS) and the conductive structure 408.

It should be understood that the circuit structure layer 30 may have other conductive structures (not shown) and/or wiring lines (not shown) to form the interconnections between the signal lines (such as the fan-out line FL, the scan line SL, the data line DL, the emitting control line EM, the power line PVDD and/or the ground potential line PVSS) and the terminals electrically connected to the outer circuits (such as the driving devices or the circuit boards).

Please continue to refer to FIG. 4. The light emitting unit LEU of the display device 10 is disposed on the insulating layer 312. The anode 504 of the light emitting unit LEU is electrically connected to the bonding pad 412, and the cathode 502 of the light emitting unit LEU is electrically connected to the bonding pad 410. In some embodiments, the display device 10 may further include an optical layer and/or a cover layer (not shown) disposed on the insulating layer 312 and the light emitting unit LEU.

In some embodiments, the insulating layer 304, the insulating layer 306, the insulating layer 308, the insulating layer 310, and the insulating layer 312 may respectively include a dielectric material. For example, the insulating layer 304, the insulating layer 306, the insulating layer 308, the insulating layer 310, and the insulating layer 312 may respectively include an inorganic dielectric material such as silicon nitride ($SiN_x$), silicon oxide ($SiO_x$), or silicon oxynitride (SiON), or an organic dielectric material such as acrylic resin, other suitable dielectric materials, or a combination thereof, but is not limited thereto. The insulating layer 304, the insulating layer 306, the insulating layer 308, the insulating layer 310, and the insulating layer 312 may respectively include a single-layered structure or a multi-layered structure, but is not limited thereto. In some embodiments, the insulating layer 308 may be used as a planarization layer and may include an organic dielectric material, but is not limited thereto.

In some embodiments, the first conductive layer CL1, the second conductive layer CL2, the third conductive layer CL3, the fourth conductive layer CL4, the fifth conductive layer CL5, and the sixth conductive layer CL6 may respectively include a conductive material. For example, the first conductive layer CL1, the second conductive layer CL2, the third conductive layer CL3, the fourth conductive layer CL4, the fifth conductive layer CL5, and the sixth conductive layer CL6 may respectively include aluminum (Al), copper (Cu), silver (Ag), chromium (Cr), titanium (Ti), molybdenum (Mo), nickel (Ni), yttrium (Mc), other metals or other suitable metal materials, or a combination or an alloy of the above metal materials, but is not limited thereto. In some embodiments, the first conductive layer CL1, the second conductive layer CL2, the third conductive layer CL3, the fourth conductive layer CL4, the fifth conductive layer CL5, and the sixth conductive layer CL6 may respectively include single-layered structure or a multi-layered structure.

In conclusion, as shown in FIG. 4, the fan-out line FL partially overlaps the pixel PU. The data writing transistor 202 is electrically connected to the scan line SL and the data line DL. The fan-out line FL is formed in a layer different from layers of the gate electrode, the source electrode and the drain electrode of the data writing transistor 202.

More specifically, the structure of the display device 10 shown in FIG. 4 may be formed by successively performing the following process steps. First, a step including patterning the semiconductor layer SE is performed to form the channel regions N of the data writing transistor 202, the driving transistor 204, and the light emitting transistor 208. Subsequently, a step including patterning the first conductive layer CL1 on the gate insulating layer 302 is performed to form the scan line SL, the emission control line EM, and/or the gate electrodes GE of the data writing transistor 202, the driving transistor 204, and the light emitting transistor 208. Subsequently, a step including patterning the second conductive layer CL2 on the insulating layer 304 is performed to form the source electrode S and drain electrode D of the data writing transistor 202, the source electrode S of the driving transistor 204, and the drain electrode D of the light emitting transistor 208, and/or the data line DL. Subsequently, a step including patterning the third conductive layer CL3 on the insulating layer 306 is performed to form the fan-out line FL and/or the conductive structure 401 and the conductive structure 401'. Subsequently, a step including patterning the fourth conductive layer CL4 on the insulating layer 308 is performed to form the conductive structure 402 and the conductive structure 404. Subsequently, a step including patterning the fifth conductive layer CL5 on the insulating layer 310 is performed to form the conductive structure 406 and the conductive structure 408. Subsequently, a step including patterning the sixth conductive layer CL6 on the insulating layer 312 is performed to form the bonding pad 410 and the bonding pad 412. Subsequently, the light emitting unit LEU is disposed on the insulating layer 312 and electrically connected to the bonding pad 410 and the bonding pad 412.

Please refer to FIG. 5, FIG. 6, FIG. 7 and FIG. 8, which are schematic partial cross-sectional views showing some exemplary configurations of the substrate 100 and control board 608 of the display device 10 according to some embodiments of the present disclosure.

Figure 5:
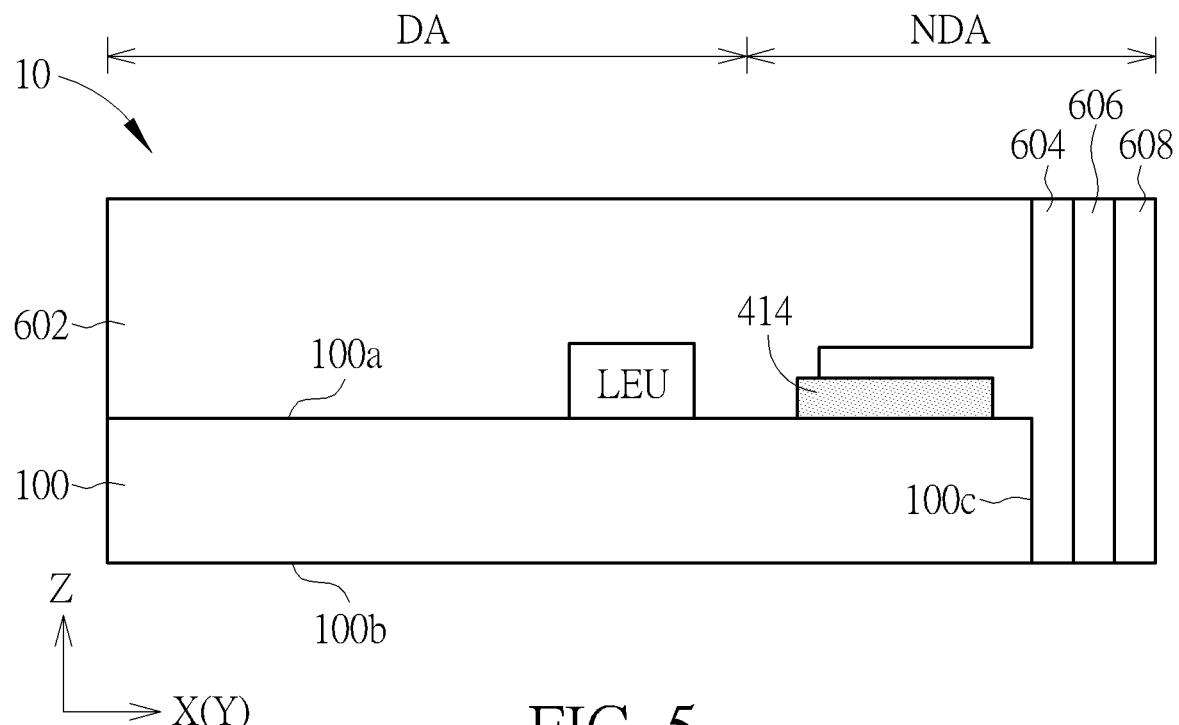
FIG. 5 to FIG. 8 are schematic partial cross-sectional views of display devices according to some embodiments of the present disclosure.

Please refer to FIG. 5. The display device 10 may include a substrate 100 having a top surface 100a, a side surface 100c surrounding an edge of the top surface 100a (shown in FIG. 1), and a bottom surface 100b that is opposite to the top surface 100a. A conductive structure 414 and a light emitting unit LEU are disposed on the top surface 100a of the substrate 100. A cover layer 602 is disposed on the top surface 100a of the substrate 100 and covers the conductive structure 414 and the light emitting unit LEU. The region of the substrate 100 having the light emitting unit LEU disposed thereon is referred to as the display region DA of the substrate 100. The region of the substrate 100 having the conductive structure 414 is referred to as the non-display region NDA of the substrate 100. The conductive structure 414 may be disposed on the region of the top surface 100a between the light emitting unit LEU and the side surface 100c. The conductive structure 414 may be electrically connected to the fan-out line FL through the circuit structure layer 30 shown in FIG. 4 and be used as a terminal of the fan-out line FL to connect to the outer circuits. A first conductive adhesive 604 may be disposed on and covering at least part of the upper surface and side surface of the conductive structure 414, part of the upper surface 100a and side surface 100c of the substrate 100, and part of the side surface of the covering layer 602. The first conductive adhesive 604 may have an approximately T-shaped cross-sectional profile. A second conductive adhesive 606 may be disposed on the side surface 100c of the substrate 100 and the side surface of the covering layer 602 and covering the first conductive adhesive 604. A control board 608 may be disposed on the side surface 100c of the substrate 100. The circuits (not shown) of the control board 608 may be electrically connected to the fan-out line FL through the second conductive adhesive 606, the first conductive adhesive 604 and the conductive structure 414. In some embodiments, the first conductive adhesive 604 may be conductive silver glue, but is not limited thereto. The second conductive adhesive 606 may be anisotropic conductive adhesive (ACF), but is not limited thereto. The control board 608 may be a flexible printed circuit (FPC) board, but is not limited thereto. In the embodiment shown in FIG. 5, by arranging the control board 608 (for example, a flexible printed circuit board) on the side surface 100c of the substrate 100, the area of the non-display area NDA may be reduced, and/or the sense of a gap at the splicing region may be reduced.

Figure 6:
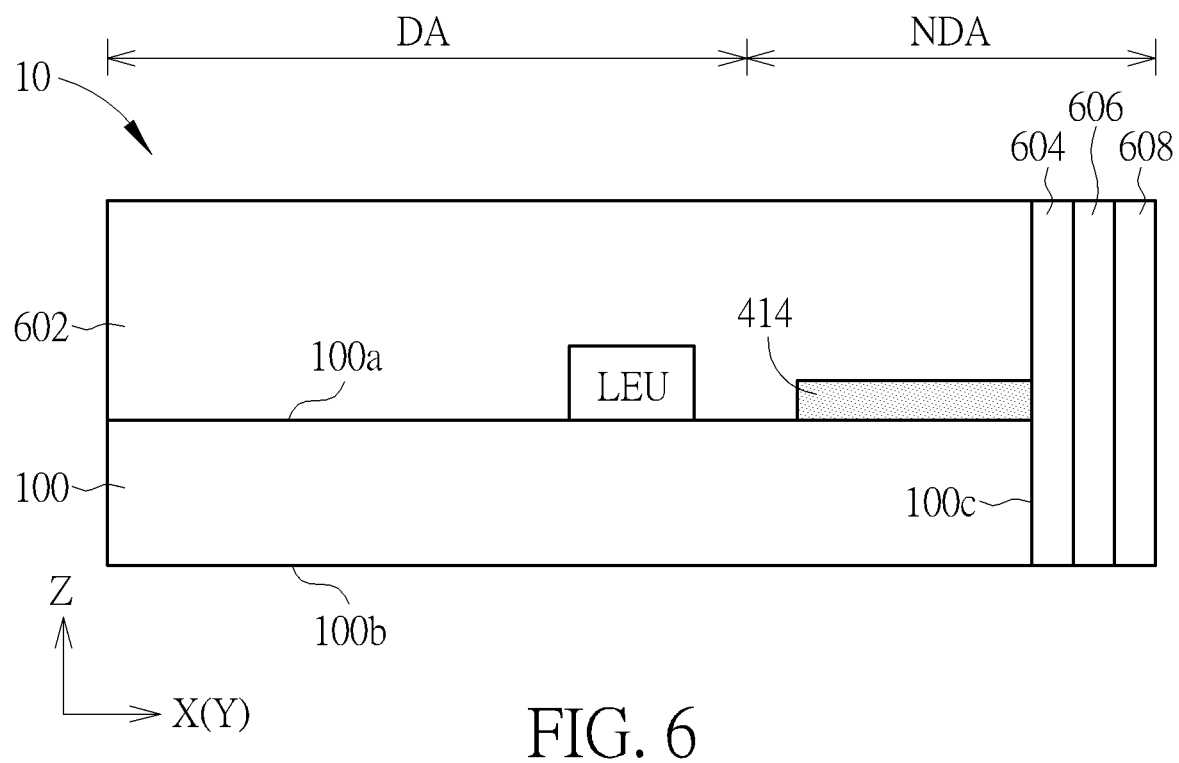

In another embodiment shown in FIG. 6, the side surface of the conductive structure 414 may be substantially aligned with the side surface 100c of the substrate 100. The first conductive adhesive 604 does not cover the upper surface of the conductive structure 414, but only covers the side surface of the conductive structure 414, the side surface 100c of the substrate 100, and the side surface of the covering layer 602. The first conductive adhesive 604 may have an approximately I-shaped cross-sectional profile.

Figure 7:
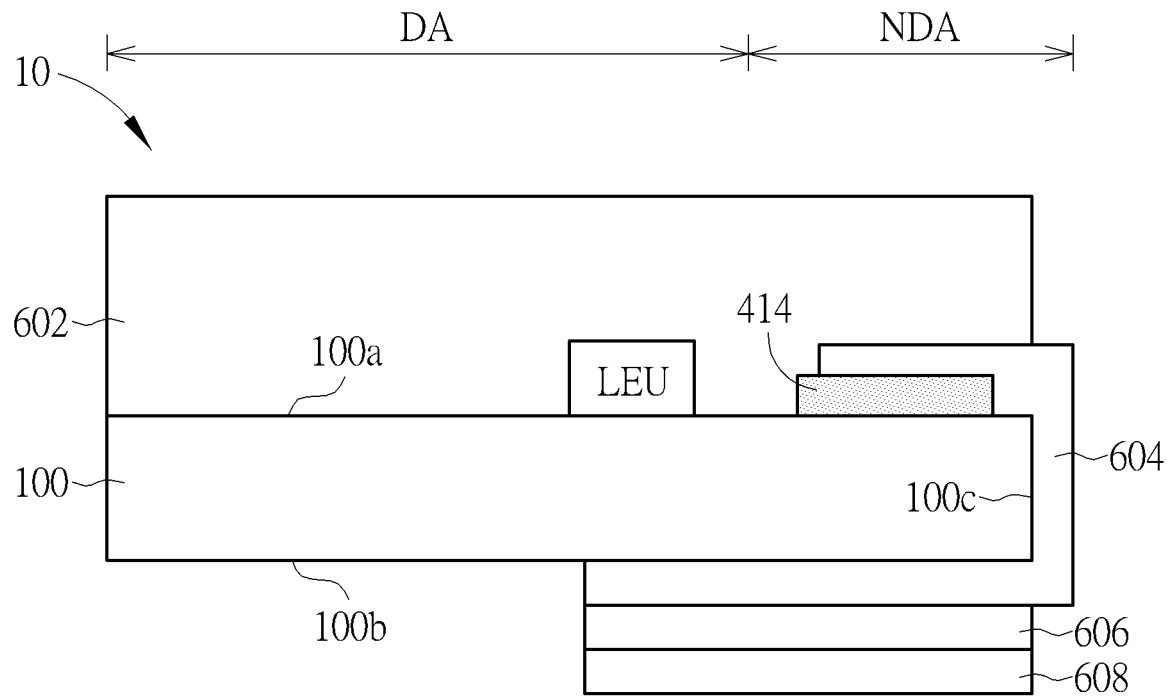

In another embodiment shown in FIG. 7, the first conductive adhesive 604 may cover at least part of the upper surface and side surface of the conductive structure 414, part of the upper surface 100a, the side surface 100c, and the bottom surface 100b of the substrate 100. The first conductive adhesive 604 may have an approximately C-shaped cross-sectional profile. The second conductive adhesive 606 covers the part of the first conductive adhesive 604 on the bottom surface 100b of the substrate 100, and the control board 608 is disposed on the bottom surface 100b of the substrate 100. The circuits (not shown) of the control board 608 may be electrically connected to the fan-out line FL through the second conductive adhesive 606, the first conductive adhesive 604 and the conductive structure 414.

Figure 8:
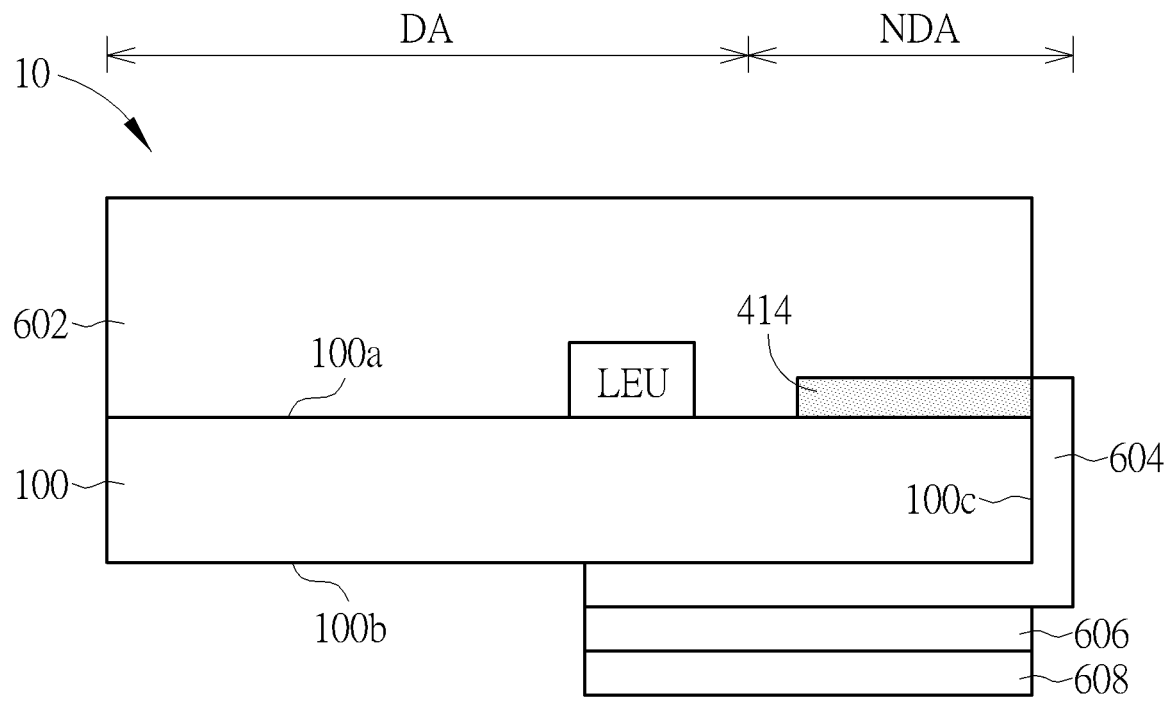

In another embodiment shown in FIG. 8, the side surface of the conductive structure 414 may be substantially aligned with the side surface 100c of the substrate 100. The first conductive adhesive 604 does not cover the upper surface of the conductive structure 414, but only covers the side surface of the conductive structure 414, and the side surface 100c and the bottom surface 100b of the substrate 100. The first conductive adhesive 604 may have an approximately L-shaped cross-sectional profile. Similar to the embodiment shown in FIG. 7, in the embodiment shown in FIG. 8, the second conductive adhesive 606 covers the part of the first conductive adhesive 604 on the bottom surface 100b of the substrate 100, and the control board 608 is disposed on the bottom surface 100b of the substrate 100. The circuits (not shown) of the control board 608 may be electrically connected to the fan-out line FL through the second conductive adhesive 606, the first conductive adhesive 604 and the conductive structure 414.

It should be noted that, in some embodiments, the control board 608 and the fan-out line FL may be electrically connected by only one of the conductive adhesives. That is, one of the first conductive adhesive 604 and the second conductive adhesive 606 may be omitted.

In conclusion, one feature of the present disclosure is that, the fan-out lines are formed by a conductive layer different from the layers of the signal lines and connect to the signal lines and the driving devices. In this way, the fan-out lines may overlap the pixels of the display region, and thereby the area of a non-display region for fanning out the fan-out lines may be reduced. The ratio of display region to the substrate may be increased. Thus, when the display devices provided by the present disclosure are used to form a spliced display apparatus, a sense of a gap or image discontinuity caused by the non-display region may be reduced, and an improved display quality may be achieved.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A display device, including:
   a substrate;
   a first signal line disposed on the substrate;
   a first pixel including a first transistor having a gate electrode formed in a first conductive layer, a source electrode formed in a second conductive layer, and a drain electrode formed in the second conductive layer, wherein the source electrode is electrically connected to the first signal line; and
   a fan-out line formed in a third conductive layer and electrically connected to the first signal line, wherein the fan-out line partially overlaps the first pixel, and the second conductive layer is disposed between the first conductive layer and the third conductive layer.

2. The display device according to claim 1, wherein the fan-out line directly contacts the first signal line.

3. The display device according to claim 1, further comprising a second signal line and a second pixel having a second transistor electrically connected to the second signal line, wherein the fan-out line crosses over the second signal line.

4. The display device according to claim 1, wherein the substrate comprises a top surface with the first signal line disposed thereon.

5. The display device according to claim 4, further comprising a flexible printed circuit board electrically connected to the fan-out line.

6. The display device according to claim 5, wherein the substrate comprises a side surface surrounding an edge of the top surface, wherein the flexible printed circuit board is disposed on the side surface.

7. The display device according to claim 6, further comprising a conductive adhesive disposed between the flexible printed circuit board and the side surface.

8. The display device according to claim 5, wherein the substrate comprises a bottom surface opposite to the top surface, wherein the flexible printed circuit board is disposed on the bottom surface.

9. The display device according to claim 1, wherein the first pixel further comprises a bonding pad and a light emitting unit bonded on the bonding pad, wherein the fan-out line does not overlap the bonding pad.

* * * * *